United States Patent [19]

Ishida et al.

[11] Patent Number: 5,027,155
[45] Date of Patent: Jun. 25, 1991

[54] IMAGE FORMING APPARATUS INCLUDING MECHANISMS FOR EXPOSURE LAMP EXCHANGE

[75] Inventors: Kazuhito Ishida; Yoichi Horaguchi, both of Nagoya, Japan

[73] Assignee: Brother Kogyo Kabushiki Kaisha, Nagoya, Japan

[21] Appl. No.: 470,310

[22] Filed: Jan. 25, 1990

[30] Foreign Application Priority Data

Jan. 28, 1989 [JP] Japan .................................. 1-18541
Jan. 30, 1989 [JP] Japan ................................ 1-9808[U]

[51] Int. Cl.$^5$ ............................................ G03G 15/04
[52] U.S. Cl. ..................................... 355/229; 355/67; 355/234
[58] Field of Search ............... 355/228, 229, 230, 232, 355/233, 234, 242, 51, 60, 65, 66, 75, 69, 67, 68

[56] References Cited

U.S. PATENT DOCUMENTS

| 3,499,710 | 3/1970 | Sahley | 355/309 X |
| 3,532,424 | 10/1970 | Miles . | |
| 3,571,612 | 3/1971 | Ukai et al. | 355/228 X |
| 3,692,401 | 9/1972 | Kawai | 355/229 X |
| 3,726,589 | 4/1973 | Difulvio et al. | 355/64 |
| 4,178,093 | 12/1979 | Yanagawa et al. | 355/234 |
| 4,277,166 | 7/1981 | van Boven et al. | 355/228 X |
| 4,459,618 | 7/1984 | Nodov | 355/233 X |
| 4,518,249 | 5/1985 | Murata et al. . | |
| 4,519,019 | 5/1985 | Hall . | |
| 4,595,278 | 6/1986 | Matsuo | 355/228 |
| 4,903,078 | 2/1990 | Yeo | 355/228 X |
| 4,922,287 | 5/1990 | Horaguchi et al. | 355/67 X |

FOREIGN PATENT DOCUMENTS 0216039 9/1988 Japan .................................. 355/230

Primary Examiner—A. T. Grimley
Assistant Examiner—Thu A. Dang
Attorney, Agent, or Firm—Oliff & Berridge

[57] ABSTRACT

An image forming apparatus includes an exposure lamp which is detachably stored in a lamp house. A cover to open and close an opening of the lamp house is prohibited from being opened by an original supporting stand while it is in an operating region for exposure of an original to light. A release member allows the original supporting stand to move beyond the operating region so that the cover can be opened to exchange the exposure lamp. When the original support member is moved beyond the operating region, an electric power source is cut off by the release member. A moving member connected with the cover also cuts off the electric power source when the cover is opened. A reflecting mirror provided around the exposure lamp is moved away from the exposure lamp automatically by a link member when the cover is opened.

33 Claims, 4 Drawing Sheets

IMAGE FORMING APPARATUS INCLUDING MECHANISMS FOR EXPOSURE LAMP EXCHANGE

BACKGROUND OF THE INVENTION

1. Field of the Invention

The present invention relates to an image forming apparatus having an exposure device in which an exposure lamp is stored, and more particularly to an image forming apparatus for exchanging a stored exposure lamp safely and easily.

2. Description of Related Art

Generally, in an image forming apparatus having an exposure device, a halogen lamp or other types of lamps are used as a light source for exposing an original. In an image forming apparatus which uses a photosensitive and pressure-sensitive recording sheet, the recording sheet is exposed by a large amount of light. The halogen lamp irradiates at a high luminance energy by receiving a high current, and consequently the lamp quickly degrades and must therefore be frequently replaced.

Recently, it has become desirable to operate an image forming apparatus at high speeds. At high speeds it is necessary to shorten the exposing time and thus the amount of luminous energy supplied to the light source of the exposure device must be increased. Therefore, it has become a practice to use a light source having a large luminous energy by greatly increasing the wattage of the light source. Consequently, durability of the light source is shortened and it is necessary to exchange the light source often.

Image forming apparatuses using an exposing method use either a slit exposing method or a whole surface exposing method. The slit exposing method can use either a movable light source or a fixed light source. A halogen lamp, a fluorescent lamp, a flash lamp and other lamps are used as the light source.

In any of the above described exposing methods, a cover member placed at the upper portion of the lamp house should be opened at first so as to exchange the halogen lamp, since the halogen lamp is stored in the lamp house. When the exposure lamp is exchanged, it is an obligation to turn off a switch for safety. However, it is possible to exchange the lamp without turning off the switch due to laziness or forgetfulness. If the lamp is exchanged without turning off the switch, there is a risk that an operator will be struck by high amounts of electricity. In an image forming apparatus using the slit exposing method in which a lamp is fixed, an original support stand is moved and a lamp house cover member is placed below the position where the original support stand is located before it begins moving. When changing the lamp, the operator opens the lamp house cover member. After the lamp is exchanged, if the operator pushes a copying switch button without closing the lamp house cover member, the lamp house cover member can be damaged by the original support stand moving horizontally.

Furthermore, in any of the above described exposing methods, a reflecting mirror is provided near the light source for directing light along a light path from the light source to the irradiated medium such as an original. Particularly, in a slit exposing method, a pair of oval-shaped reflecting mirrors are provided for partly surrounding the light source to condense the light from the light source into a slit shape. Conventionally, the reflecting mirrors are fixed near the light source and cannot be separated from the light source. Thus, in the above described conventional exposure device, the light source cannot be exchanged without removing the reflecting mirrors, since the reflecting mirrors are fixed near the light source. It is difficult to attach or detach the reflecting mirrors. Therefore, an exchanging operation requires much time and labor.

SUMMARY OF THE INVENTION

Accordingly, it is an object of the present invention to provide an image forming apparatus for exchanging a lamp safely.

Another object of the present invention is to provide an image forming apparatus in which there is no danger of a lamp house cover being damaged while a lamp is being exchanged.

A further object of the present invention is to provide an image forming apparatus in which the operator can exchange the lamp easily and quickly.

According to the present invention, there is provided an image forming apparatus having an exposure device comprising: a housing; a lamp house disposed in said housing and having an opening; covering means provided on said housing for opening and closing said opening; an exposure lamp detachably stored in said lamp house; original support means movably provided on said housing for supporting an original thereon, said original support means being movable in a first region for exposure and a second region beyond said first region, wherein at least a portion of said original support means is located on said covering means while said original support means is in said first region so that said covering means is prohibited from being opened; engaging means for engaging with said original support means, said engaging means being movable between a first position to restrict the movement of said original support means within said first region by engagement with the original support means and a second position to allow said original support means to move into said second region by releasing the engagement; power supply means for supplying electric power to said exposure lamp; and switching means operatively connected with said engaging means for switching off the electric power supply while said engaging means is in said second position.

According to another aspect of the invention, there is provided an image forming apparatus having an exposure device which comprises: a housing; a lamp house disposed in said housing and having an opening; covering means provided on said housing for opening and closing said opening; an exposure lamp detachably stored in said lamp house; original support means movably provided on said housing for supporting an original thereon, said original support means being movable in a first region for exposure and a second region beyond said first region, wherein at least a portion of said original support means is located on said covering means while said original support means is in said first region so that said covering means is prohibited from being opened; engaging means for engaging with said original support means, said engaging means being movable between a first position to restrict the movement of said original support means within said first region by engagement therewith and a second position to allow said original support means to move into said second region by releasing the engagement; power supply means for supplying electric power to said exposure lamp; a moving member being movable in connection with said covering means; and switching means operatively connected with both said engaging means and said moving member for switching off the electric power supply under at least one of a releasing situation at which said engaging means is in said second position and a moving situation at which said moving member is moved by said covering means.

According to a further aspect of the present invention, there is provided an image forming apparatus having an exposure device which comprises: a housing; a lamp house disposed in said housing and having an opening; covering means provided on said housing for opening and closing said opening; an exposure lamp detachably stored in said lamp house; original support means provided on said housing for supporting an original thereon; reflector means provided around said exposure lamp for reflecting light from said exposure lamp to said original, said reflector means being movable between an operating position close to said exposure lamp and a release position far from said exposure lamp; and link means for linking said covering means and said reflector means so that said reflector means moves to said release position while said covering means is being opened so that said exposure lamp is easily accessible through said opening.

BRIEF DESCRIPTION OF THE DRAWINGS

The above and other objects, features and advantages of the invention will become more apparent from reading the following description of the preferred embodiment taken in connection with the accompanying in which.

DETAILED DESCRIPTION OF THE PREFERRED EMBODIMENT

Figure 1:
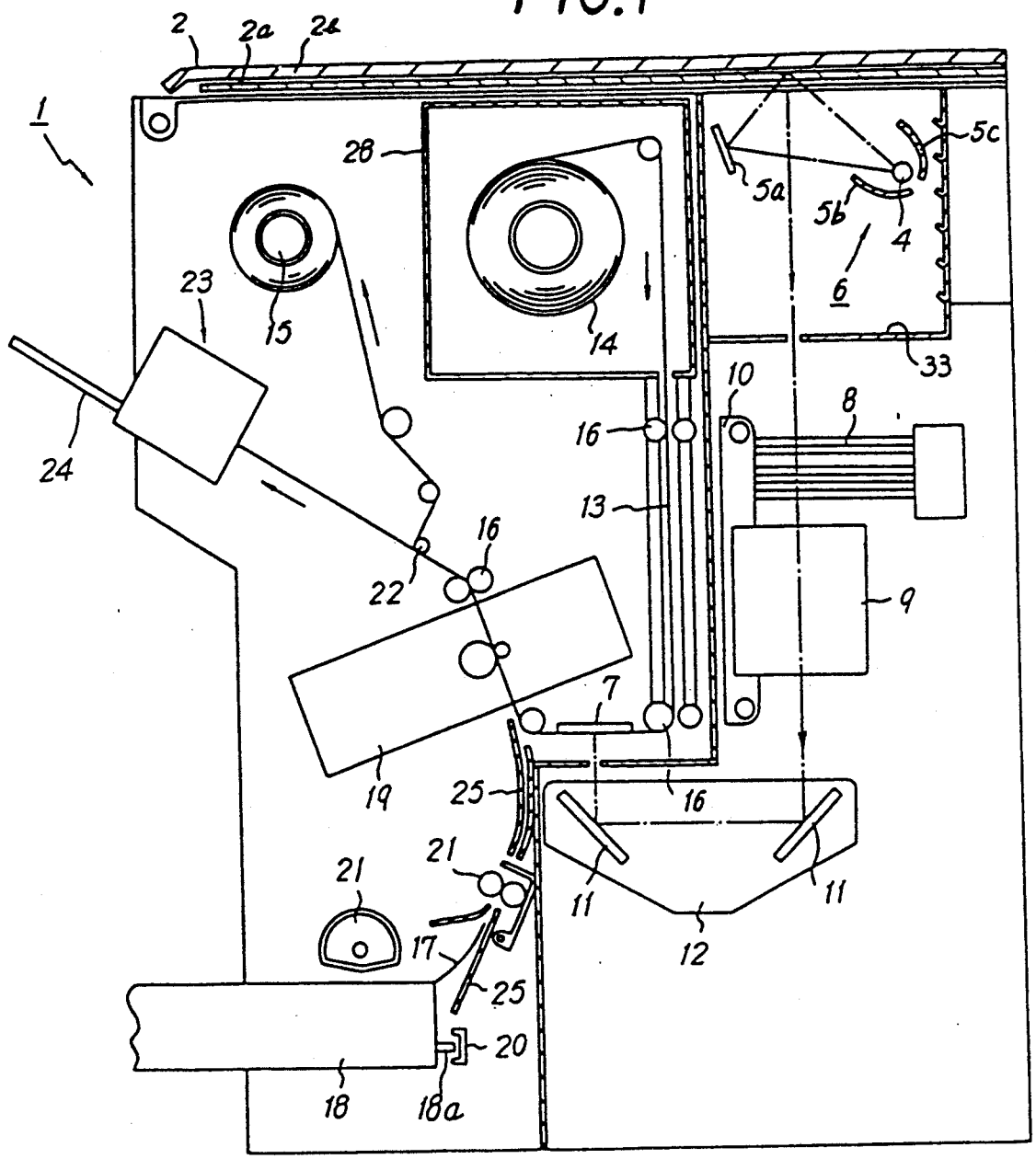
FIG. 1 shows an image forming apparatus according to an embodiment of the present invention.

FIG. 1 schematically shows an image forming apparatus. The illustrated image forming machine, generally indicated by a character "1" comprises an original support stand 2 which is movable back and forth. The original support stand 2 comprises an original support stand glass 2a on which an original is placed and an original support stand cover 2b for opening and closing the original support stand glass 2a. The image forming machine 1 also has a lamp house 33 disposed below the original support glass 2. The lamp house 33 comprises a halogen lamp 4 extending in a direction normal to the direction in which the original support stand glass 2a is movable and detachable reflecting mirrors 5a, 5b and 5c for reflecting light from the halogen lamp 4 to the original support stand glass 2a. A light source unit 6 consists of the halogen lamp 4 and the reflecting mirrors 5a, 5b and 5c. When the original support stand 2 moves back and forth, the light emitted from the halogen lamp 4 of the light source unit 6 continuously irradiates the entire surface of the original.

In the image forming portion of the machine, an exposure table 7 is placed in a center portion of a body of the image recording machine 1. A filter 8 for adjusting the colors of a copied image and a lens 9 for converging the light are mounted on an attachment 10 between the exposure table 7 and light source unit 6. A pair of reflecting mirrors 11 for angularly adjusting to vary the length of a light path and focusing an image between the lens 9 and the exposure table 7 are adjustably mounted on an attachment 12 between the lens 9 and the exposure table 7. After the light irradiates the original, the light reflected from the original is reflected by the mirrors 11 through the filter 8 and the lens 9, and is then led to the exposure table 7.

A removable cassette 28 storing a cartridge 14 is placed in an upper portion of the image recording machine 1. A take-up roller 15 is rotatably supported at a left side of the cassette 28. An elongated web-like microcapsule sheet 13 is wound around the cartridge 14. The microcapsule sheet 13 is a photosensitive pressure-sensitive recording sheet comprising an immense number of microcapsules which include different colors for multi-color copying. The microcapsule sheet 13 is discharged from the cartridge 14 and fed by a plurality of rollers 16 and then wound by the take-up roller 15. While a part of the microcapsule sheet 13 passes under the exposure table 7, the microcapsule sheet 13 is exposed and a latent image of the original is formed on the microcapsule sheet 13.

A removable developer sheet cassette 18 storing a stack of developer sheets 17 is disposed below the exposure table 7 in the body of the image forming machine 1. A pressure developing unit 19 is placed between the exposure table 7 and the take-up roller 15. The microcapsule sheet 13 and the developer sheet 17 are pressed against each other in the pressure developing unit 19. At this time, a color image based on the latent image which is partly formed on the exposed microcapsule sheet 13 is formed on the developer sheet 17. A heat melting resin is previously laid on a surface of the color developer sheet 17. A paper having a small heat capacity, polyethylene terephthalate having a large heat capacity and/or other materials can be used as the substrate. A protrusion 18a for judging a size of the developer sheet 17 is provided on the developer sheet cassette 18. In the image forming machine 1, a detecting device 20 is provided for judging a size of the developer sheet 17 by detecting a size of the protrusion 18a.

A plurality of feeding rollers 21 and a sheet guide 25 is provided between the developer sheet cassette 18 and the pressure developing unit 19 for feeding the developer sheet 17 to the pressure developing unit 19. At an output side of the pressure developing unit 19, a separating roller 22 is provided for separating the developer sheet 17 from the microcapsule sheet 13. A thermal fixing unit 23 for thermally fixing the image on the developer sheet 17 is provided at an output side of the separating roller 22. The developer sheet 17 discharged from the thermal fixing unit 23 is conveyed to the tray 24.

When a color copying operation is operated in the image forming machine 1, a start button 49 is depressed. Then, the original support stand glass 2a is moved to a second position at a right end (in FIG. 1) of the body of the image forming machine 1. At this time, a left end of the original confronts the halogen lamp 4 in the light source unit 6. While the halogen lamp 4 is irradiating, the original supporting glass 2a is moved leftwardly for returning to the first position, at which time the halogen lamp irradiating is finished.

When the lamp 4 is irradiating, the microcapsule sheet 13 on the exposure table 7 moves toward the take-up reel 15 at the same speed as the original supporting stand 2. Thereby, the latent image of the original is formed on the microcapsule sheet 13. The developer sheet 17 is discharged from the developer sheet cassette 18 and fed toward the pressure developing unit 19 simultaneously with the return movement of the original supporting stand 2. The developed portion of the microcapsule sheet 13 and the developer sheet 17 are pressed against each other in the pressure developing unit 19. Thus, a color image is formed on the developing sheet 17. The developer sheet 17 is introduced into the thermal fixing unit 23 by the feeding roller 16 and the other members. In the thermal fixing unit 23, the image on the developer paper 17 is thermally fixed and then the developer sheet 17 is discharged.

Figure 2:
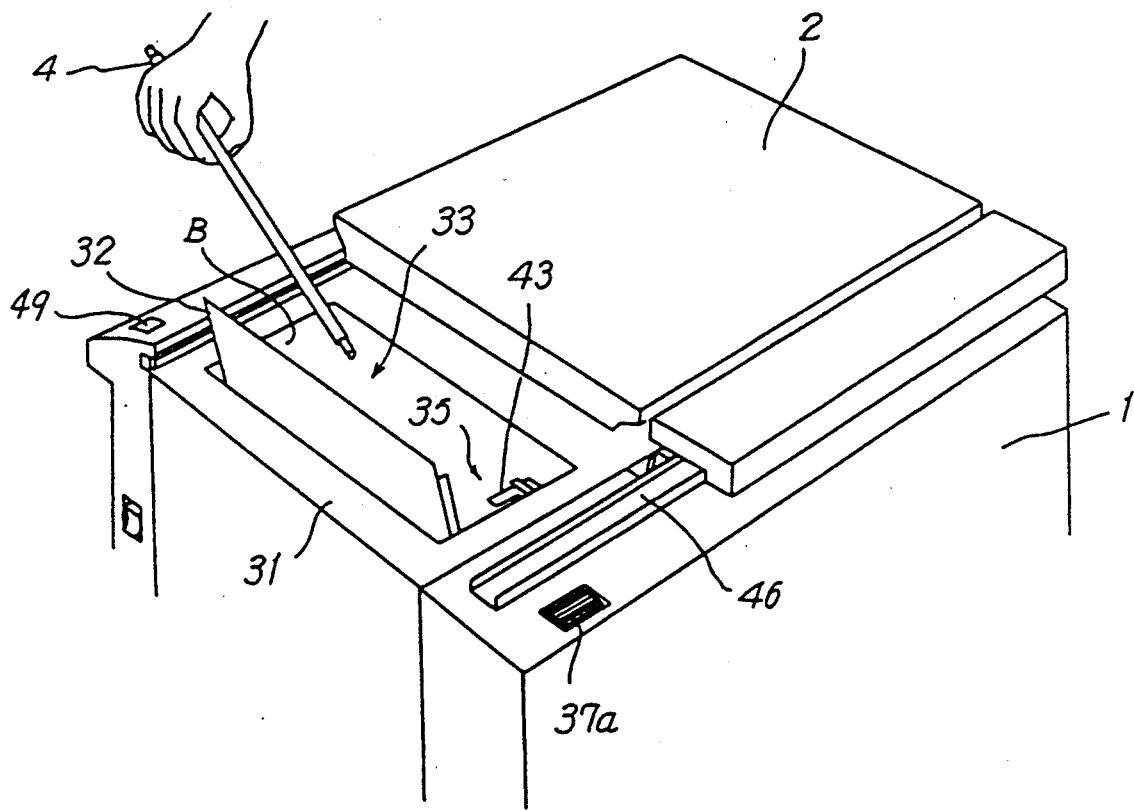
FIG. 2 is a fragmentary perspective view of the image forming machine.

Under the construction of the above described image forming machine, as shown in FIG. 2, a lamp house cover 32 for opening an opening B of the lamp house 33 is provided at an upper portion 31 of the body of the image forming machine 1. When the original supporting stand 2 is moved to a predetermined exchange position (as shown in FIG. 2), the lamp house cover 32 is uncovered. The lamp house cover 32 is opened for exchanging the halogen lamp 4 stored in the lamp house 33.

Figure 3:
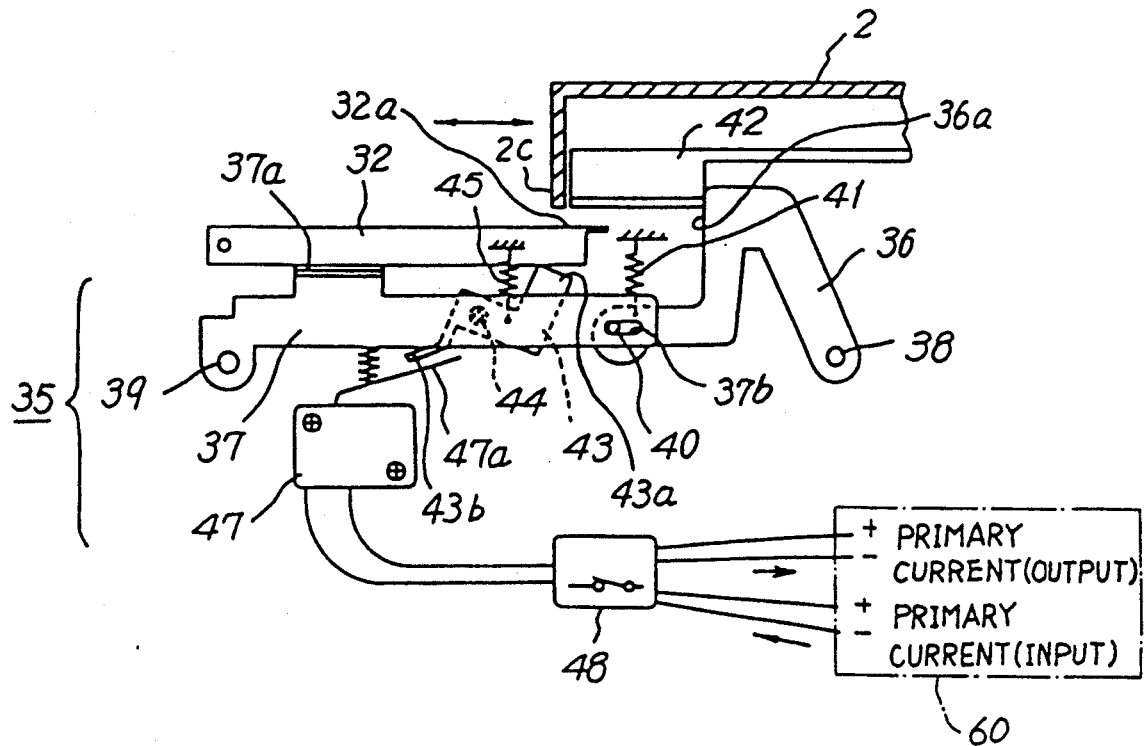
FIG. 3 shows a cross-sectional view of a switch device of the image forming machine.

A switching device 35 is provided in the image forming machine 1. The switching device 35 comprises an original support stand stop lever 36 and an original support stand release lever 37 as shown in FIG. 3. One end of the original support stand stop lever 36 is rotatably supported at a fixed portion of the body of the image forming machine 1 by a pin 38. One end of the lever 37 is rotatably supported at a fixed portion of the body of the image forming machine 1 by a pin 39. Free ends of the lever 36 and the lever 37 are connected to each other by engagement of a pin 40 provided on the lever 36 with a slit 37b provided on the lever 37. The angle between the lever 36 and the lever 37 is freely changeable. Ordinarily, the lever 36 and the lever 37 are connected horizontally by a force of the tension spring 41 as shown in FIG. 3. In this condition, a contacting portion 36a of the lever 36 is placed at a position for engaging with a portion of the engaging member 42 provided on an inner surface of the original support stand 2. During a copying operation, a movement of the original support stand 2 is restricted within an operating region for an exposure by the engagement member 42 such that the original support stand 2 can not move rightwardly, that is beyond the operating region, from a copying position as shown in FIG. 3. At this time, the left end portion 2c of the original support stand 2 is located above a free end 32a of the lamp house cover 32, so that the lamp house cover 32 can not be opened.

The switch device 35 further comprises a switch pressing lever 43. The switch pressing lever 43 is rotatably supported at the fixed portion of the body of the image forming machine 1 with a pin 44. The switch pressing lever 43 is provided independently from the lever 36 and the lever 37. The switch pressing lever 43 is urged counter-clockwise in FIG. 3 by a tension spring 45 so as to open the lamp house cover 32. However, in a normal copying condition, an upper end portion 43a of the switch pressing lever 43 is contacted by lamp house cover 32, so that the switch pressing lever 43 is urged to move in the clockwise direction against the spring force provided by the tension spring 45 by the weight of the lamp house cover 32 as shown in FIG. 3. Further, the switch device 35 comprises a switch 47 having a switch lever 47a which can contact both lever 37 and a tip portion 43b of the switch pressing lever 43. A primary power source 60 is connected to the switch 47 via a power relay 48. In the embodiment shown in FIG. 2, the lever 43 is attached at an inside of the lamp house 33 and the other levers 36 and 37 are attached near a running rail 46 of the original support stand 2. A pressing portion 37a of the lever 37 can be seen at an upper end portion of the body of the image recording machine 1.

Figure 4:
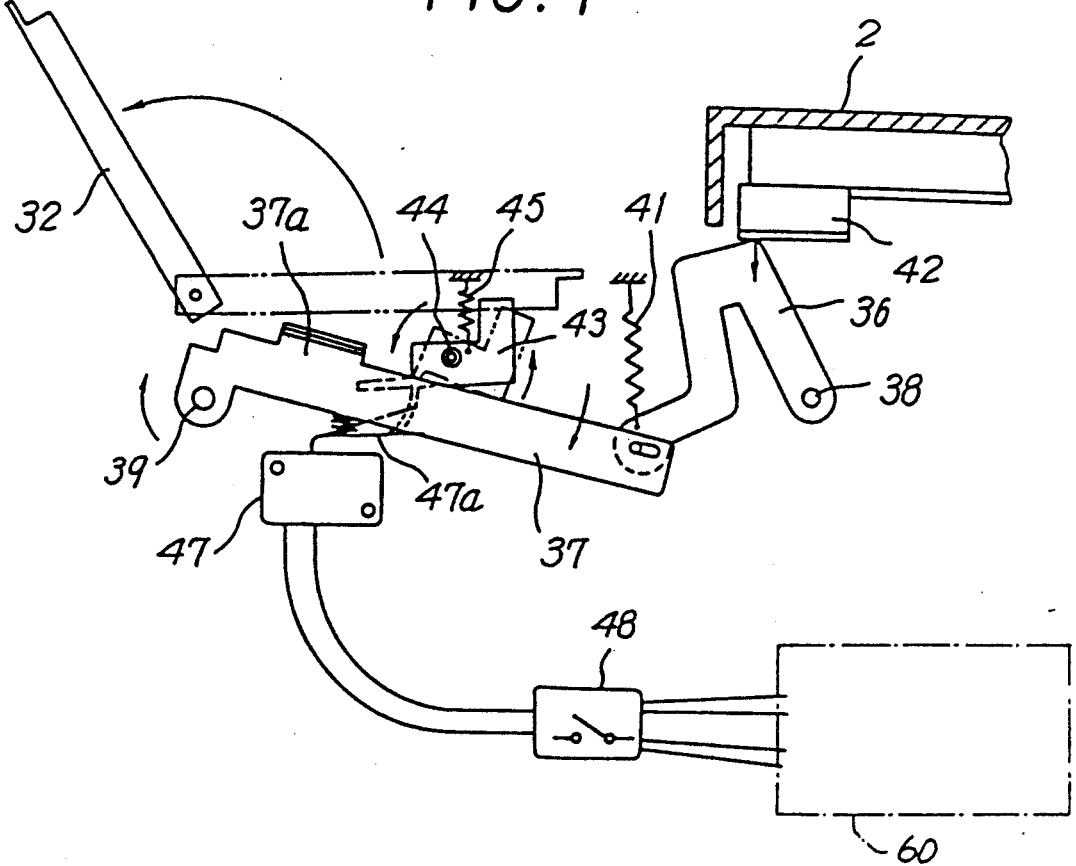
FIG. 4 is a cross-sectional view showing an operation of the switch device.

According to this embodiment, when the halogen lamp 4 is exchanged, the pressing portion 37a of the lever 37 is pressed down so as to move the original supporting stand 2 horizontally to the predetermined exchange position shown in FIGS. 2 and 4. Next, as shown in FIG. 4, the link of the lever 36 and the lever 37 bends at the middle portion thereof and the lever 36 rotates along a direction as shown in FIG. 4 so that the engagement between the lever 36 and the engaging member 42 is released. At this time, the lever 37 presses the switch lever 47a and the primary power source 60 is turned OFF via the power relay 48. After that, as shown in FIG. 2, the original support stand 2 is horizontally moved to the exchange position beyond the operating region indicated in FIGS. 2 and 4 for exposing an entire surface of the lamp house cover 32. At this time, the engaging member 42 slides over an upper portion of the lever 36 and presses downwardly on the lever 36. From this time on, as shown in FIG. 4, the levers 36 and 37 are maintained in a condition whereby the levers 36 and 37 bend at the middle portion thereof. Accordingly, when the original support stand 2 is located at the predetermined exchange position of the body of the image recording machine 1, the lever 37 continuously presses the switch lever 47a and the primary power source 60 is turned off via the power relay 48.

After opening the lamp house cover 32, the halogen lamp 4 in the lamp house 33 is exchanged. At this time, since the primary power source 60 is OFF as described above, a safe exchanging operation is sufficiently assured. When the lamp house cover 32 is opened, the switch pressing lever 43 rotates counter-clockwise due to the spring force of the tension spring 45, so that the tip portion 43b of the switch pressing lever 43 presses the switch lever 47a. According to the above mechanism, the primary power source 60 of the halogen lamp 4 is also turned OFF by the pressing lever 43 via the relay 48. Thus, the safety of the exchanging operation is doubly assured. Even if the original support stand 2 moves horizontally from the position shown in FIG. 4 towards the left, causing the lever 36 to be released from the engaging member 42, and causing the switch lever 47a to be released from the lever 37, the primary power source 60 remains OFF as long as the lamp house cover 32 is opened. Therefore, the safety of the lamp exchanging operation is sufficiently assured.

Figure 5:
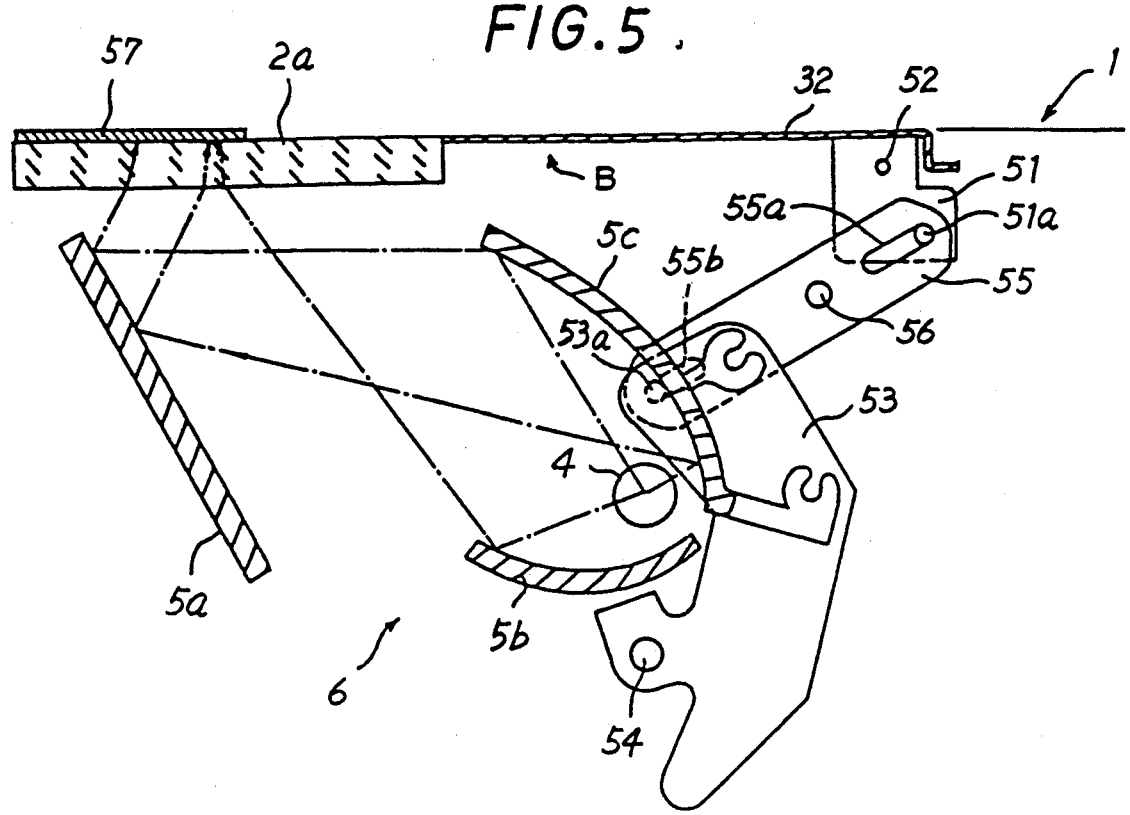
FIG. 5 shows a cross-sectional view of a light source unit.
Figure 6:
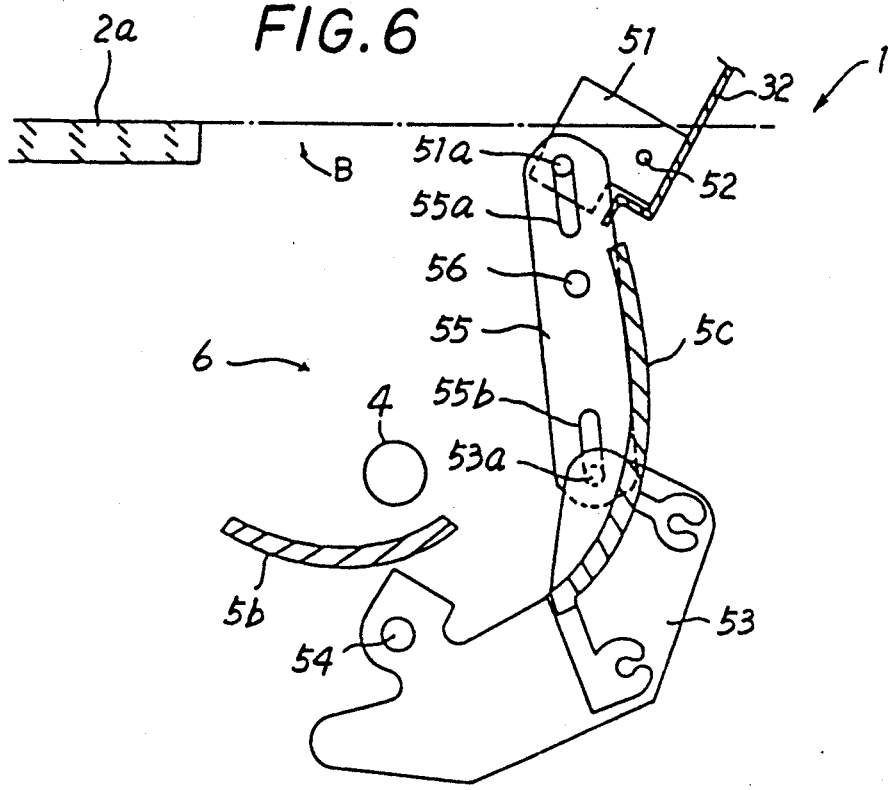
FIG. 6 shows a cross-sectional view of the light source unit when a lamp is exchanged.

Next, the light source unit 6 will be explained in detail with reference to the drawings. FIGS. 5 and 6 show a light source unit 6 of the image forming machine 1. FIG. 5 is an enlarged cross-sectional view of the light source unit 6 in an operating condition. FIG. 6 shows an enlarged cross-sectional view of the light source unit 6 in a lamp exchanging operation.

In FIG. 5, the light source unit 6 is placed at an upper right portion of the image forming machine 1 as shown in FIG. 1. A pair of oval-shaped reflecting mirror 5b and 5c partly surround and are placed near a halogen lamp 4 (hereinafter, the halogen lamp is referred to as "the lamp 4"). A lower reflecting mirror 5b of the pair of oval-shaped reflecting mirrors 5b and 5c is fixed substantially below the lamp 4. Another upper reflecting mirror 5c is movably provided above the lamp 4. The lamp house cover 32 for covering the opening B is rotatably attached at the bracket 51 to pivotably rotate on a fulcrum 52. The opening B is placed above the upper reflecting mirror 5c. A fulcrum 54 is placed substantially below the lower reflecting mirror 5b and the holder 53 for the upper reflecting mirror 5c is pivotally supported on the fulcrum 54. A rear side of the upper reflecting mirror 5c is attached to the holder 53. An upper side of the holder 53 is connected to the bracket 51 of the lamp house cover 32 by a link 55. The link 55 is rotatably supported on a fulcrum 56 at the middle portion of the link 55. Slits 55a and 55b are provided at both ends of the link 55, respectively. A protrusion 51a provided at the bracket 51 is inserted into the slit 55a and slides freely in the slit 55a and a protrusion 53a provided at the holder 53 is inserted into the slit 55b and slides freely in the slit 55b so that the bracket 51 and the holder 53 are connected by the link 55.

During an operating condition of the light source unit 6 as shown in FIG. 5, the light from the lamp 4 directly irradiates the original support stand glass 2a and the irradiated light is reflected from the reflecting mirrors 5b, 5c and the reflecting mirror 5a and condensed on an original 57 on the original support stand glass 2a. Alternate long and short dash lines in FIG. 5 show a path of the irradiated light.

The operation for exchanging the light source in the above described embodiment will be described. Based on FIG. 5 showing the operating condition of the light source unit 6, the exchanging operation will be explained according to FIG. 6 which shows the lamp exchanging condition while the lamp house cover 32 is opened. When the lamp 4 is exchanged at first the opening B should be opened by rotating the lamp house cover 32 clockwise on the fulcrum 52. In accordance with the rotation of the lamp house cover 32, the protrusion 51a also rotates clockwise relative to the fulcrum 52. While the protrusion 51a is rotating, the protrusion 51a reciprocates in the slit 55a. On the other hand, the link 55 rotates counter-clockwise around the fulcrum 56 to be placed in a substantially vertical position. At the same time, the holder 53 rotates clockwise on the fulcrum 54 according to the rotation of the link 55. In the above mechanism, as shown in FIG. 6, the upper reflecting mirror 5c moves rightwardly and is moved away from the lamp 4 when the lamp house cover 32 is opened. In this condition, the lamp 4 appears under the opening B, when the lamp house cover 32 is opened, and the lamp 4 can be easily exchanged by hand.

After the lamp 4 is exchanged, the lamp house cover 32 is rotated counter-clockwise on the fulcrum 52 to close the opening B so that the link 55 rotates clockwise around the fulcrum 56 in accordance with the rotation of the linked lamp house cover 32, and the holder 53 is returned to the first position. After closing the lamp house cover 32, the upper reflecting mirror 5c is located near the lamp 4 and directs the light from the lamp 4 to the original 57 on the original support stand glass 2a.

Although certain preferred embodiments have been shown and described, it should be understood that many changes and modifications may be made therein without departing from the scope of the appended claims. For example, in the above embodiment, while a link is used for shortening or lengthening a space between the upper reflecting mirror and the halogen lamp depending on an opening or closing action of the lamp house cover, a gear mechanism may be used instead of the link. A sliding type of lamp house cover may be employed instead of a rotatable cover. In the sliding type of cover, the reflecting mirror may be moved depending on a sliding movement of the lamp house cover. Although two reflecting mirrors are used in the above described embodiment, the number of separated reflecting mirrors is not limited. Additionally, in accordance with the opening or closing action of the lamp house cover, all of the reflecting mirrors may be moved. Other lamps, such as a fluorescent lamp may be used instead of the halogen lamp. The moving mechanism of the reflection mirror can also be used for an image forming apparatus which employs a movable light source or which irradiates the whole surface of an original at one time.

What is claimed is:

1. An image forming apparatus having an exposure device comprising:
   a housing;
   a lamp house disposed in said housing, said lamp house including an opening;
   covering means provided on said housing for opening and closing said opening;
   an exposure lamp detachably stored in said lamp house;
   original support means movably provided on said housing for supporting an original thereon, said original support means being movable in a first region for exposing an original supported thereon and a second region located beyond said first region, wherein at least a portion of said original support means is located over said covering means while said original support means is in said first region so that said covering means is prohibited from being opened;
   engaging means for engaging said original support means, said engaging means being movable between a first position for restricting the movement of said original support means within said first region by engagement with said original support means and a second position for allowing said original support means to move into said second region by releasing the engagement;
   power supply means for supplying electric power to said exposure lamp; and
   switching means operatively connected with said engaging means for switching off the electric power supply while said engaging means is in said second position.

2. An image forming apparatus according to claim 1, wherein said power supply means includes a primary power source, and wherein said switching means switches off the primary power source.

3. An image forming apparatus according to claim 2, wherein said switching means includes a relay connected to said primary power source and a switch connected to said relay, wherein said switch is operated by said engaging means.

4. An image forming apparatus according to claim 3, wherein said engaging means includes a release element having an operating portion which is accessible from outside of said housing, and wherein said switch is operated by said release element.

5. An image forming apparatus according to claim 4, wherein said engaging means further includes a stop element having an engaging portion engageable with said original support means, said release element and said stop element being pivotally linked to each other.

6. An image forming apparatus according to claim 1, wherein said original support means includes a pressing portion for pressing said engaging means, said pressing portion keeping said engaging means in said second position by making pressing contact with said engaging means while said original support means is in said second region so that said electric power supply is maintained in an off-state.

7. An image forming apparatus according to claim 1, wherein said covering means includes a cover movably supported around an axis to said housing, wherein an edge portion of said original supporting means is located over a free end of said cover when the movement of said original support means is restricted by said engaging means.

8. An image forming apparatus according to claim 1, further comprising:
  reflector means provided around said exposure lamp for reflecting light from said exposure lamp to said original, said reflecting means being movable between an operating position close to said exposure lamp and a release position far from said exposure lamp; and
  link means for linking said covering means and said reflector means, said link means causing said reflector means to move to said release position while said covering means is opened so that said exposure lamp is easily accessible through said opening.

9. An image forming apparatus having an exposure device comprising:
  a housing;
  a lamp house disposed in said housing, said lamp house including an opening;
  covering means provided on said housing for opening and closing said opening;
  an exposure lamp detachably stored in said lamp house;
  original support means movably provided on said housing for supporting an original thereon, said original support means being movable in a first region for exposing an original supported thereon and a second region located beyond said first region, wherein at least a portion of said original support means is located over said covering means while said original support means is in said first region so that said covering means is prohibited from being opened;
  engaging means for engaging said original support means, said engaging means being movable between a first position for restricting the movement of said original support means within said first region by engagement with said original support means and a second position for allowing said original support means to move into said second region by releasing the engagement;
  power supply means for supplying electric power to said exposure lamp;
  a moving member being movable in response to movement of said covering means; and
  switching means operatively connected with both said engaging means and said moving member for switching off the electric power supply under at least one of a releasing situation at which said engaging means is in said second position and a moving situation at which said moving member is moved by said covering means.

10. An image forming apparatus according to claim 9, wherein said power supply means includes a primary power source, and wherein said switching means switches off the primary power source.

11. An image forming apparatus according to claim 10, wherein said switching means includes a relay connected to said primary power source and a switch connected to said relay, wherein said switch is operated by said engaging means.

12. An image forming apparatus according to claim 11, wherein said engaging means includes a release element having an operating portion being accessible from outside of said housing, and wherein said switch is operated by said release element.

13. An image forming apparatus having an exposure device comprising:
  a housing;
  a lamp house disposed in said housing, said lamp house including an opening;
  covering means provided on said housing for opening and closing said opening;
  an exposure lamp detachably stored in said lamp house;
  original support means provided on said housing for supporting an original thereon;
  reflector means provided around said exposure lamp for reflecting light from said exposure lamp to said original, said reflector means being movable between an operating position close to said exposure lamp and a release position far from said exposure lamp; and
  link means for linking said covering means and said reflector means to each other and for moving said reflector means to said release position while said covering means is being opened so that said exposure lamp is easily accessible through said opening.

14. An image forming apparatus according to claim 13, wherein said reflector means includes plural reflecting members, at least one of said reflecting members being provided between said exposure lamp and said opening and being movable between the operating position and the release position.

15. An image forming apparatus according to claim 14, wherein said covering means includes a cover movably supported on said housing around a first axis, said at least one reflecting member being movably supported around another axis which is parallel to said first axis, and wherein said link means transforms a movement of said cover into a movement of said at least one reflecting member.

16. An image forming apparatus which includes an exposure device for exposing an original to light, comprising:
  a housing;
  a lamp house disposed in said housing, said lamp house including an opening;
  covering means provided on said housing for opening and closing said opening;
  means for detachably storing an exposure lamp in said lamp house;
  original support means movably provided on said housing for supporting an original thereon, said original support means being movable in a first region for exposing an original supported thereon and a second region located beyond said first region, wherein at least a portion of said original support means is located over said covering means while said original support means is in said first region so that said covering means is prohibited from being opened, said portion of the original support means not being located over said covering means while said original support means is in said second region so that said covering means can be opened;

power supply means for supplying electric power to said means for detachably storing an exposure lamp; and switching means for switching off the electric power supply when said original support means is in said second region.

17. An imaging forming apparatus according to claim 16, further comprising;

engaging means for engaging said original support means, said engaging means being movable between a first position for restricting the movement of said original support means within said first region by engagement with said original support means and a second position for allowing said original support means to move into said second region by releasing the engagement; and wherein said switching means is operatively connected with said engaging means and switches off said electric power supply while said engaging means is in said second position.

18. The image forming apparatus according to claim 17, wherein said engaging means includes a release element having an operating portion which is accessible from outside of said housing, and wherein said switch is operated by said release element.

19. The image forming apparatus according to claim 16, further comprising:

a moving member being movable in response to movement of said covering means from a closed position to an open position, and wherein said switching means also switches off the electric power supply when said moving member is moved to said open position.

20. An image forming apparatus according to claim 16, further comprising:

reflector means provided around said means for detachably storing said exposure lamp for reflecting light from said exposure lamp to said original, said reflecting means being movable between an operating position close to said exposure lamp and a release position far from said exposure lamp; and link means for linking said covering means and said reflector means, said link means causing said reflector means to move to said release position while said covering means is open so that said exposure lamp is easily accessible through said opening.

21. An image forming apparatus which includes an exposure device for exposing an original to light comprising:

a housing;

a lamp house disposed in said housing, said lamp house including an opening;

covering means provided on said housing for opening and closing said opening, said covering means being movable between an open position and a closed position;

an exposure lamp detachably stored in said lamp house;

reflector means provided around said exposure lamp for reflecting light from said exposure lamp to said original, said reflector means being movable between an operating position close to said exposure lamp and a release position far from said exposure lamp; and link means for linking said covering means and said reflector means, said link means causing said reflector means to move to said release position while said covering means is open so that said exposure lamp is easily accessible through said opening;

power supply means for supplying electric power to said exposure lamp; and switching means for switching off the electric power supply when said covering means is moved to said open position.

22. An image forming apparatus according to claim 21, further comprising:

a moving member being movable in response to movement of said covering means between said open and closed positions, and wherein said switching means is operatively connected to said moving member and switches off said electric power supply in response to movement of said moving member when said covering means moves to said open position.

23. An image forming apparatus according to claim 21, further comprising:

original support means movably provided on said housing for supporting an original thereon, said original support means being movable in a first region for exposing an original supported thereon and a second region located beyond said first region, wherein at least a portion of said original support means is located over said covering means while said original support means is in said first region so that said covering means is prohibited from being opened, said portion of the original support means not being located over said covering means while said original support means is in said second region enabling said covering means to be opened, and wherein said switching means also switches off the electric power supply when said original support means is in said second position.

24. An image forming apparatus according to claim 23, further comprising:

engaging means for engaging said original support means, said engaging means being movable between a first position for restricting the movement of said original support means within said first region by engagement with said original support means and a second position for allowing said original support means to move into said second region by releasing said engagement; and wherein said switching means is operatively connected with said engaging means and switches off said electric power supply while said engaging means is in said second position.

25. An image forming apparatus which includes an exposure device for exposing an original to light, comprising:

a housing;

a lamp house disposed in said housing, said lamp house including an opening;

covering means provided on said housing for moving between an open position and a closed position for opening and closing said opening;

means for detachably holding an exposure lamp in an operative position in said lamp house;

reflector means, provided around said operative position in said lamp house, for reflecting light provided by an exposure lamp to an original, said reflector means being movable between an operating position close to said operative position and a release position far from said exposure lamp; and means for moving said reflector means from said operating position to said release position by moving said covering means from said closed position to said open position.

26. An image forming apparatus according to claim 25, further comprising:

link means for linking said covering means and said reflector means to each other, said link means moving said reflector means to said release position when said covering means is moved to said open position.

27. An image forming apparatus according to claim 26, wherein said reflector means includes plural reflecting members, at least one of said reflecting members being provided between said exposure lamp and said opening and being movable between the operating position and the release position.

28. An image forming apparatus according to claim 27, wherein said covering means includes a cover movably supported on said housing around a first axis, said at least one reflecting member being movably supported around another axis which is parallel to said first axis, and wherein said link means transforms a movement of said cover into a movement of said at least one reflecting member.

29. An image forming apparatus according to claim 25, further comprising:

original support means movably provided on said housing for supporting on original thereon, said original support means being movable in a first region for exposing an original supported thereon and a second region located beyond said first region, wherein at least a portion of said original support means is located over said covering means while said original support means is in said first region so that said covering means is prohibited from being opened, said portion of the original support means not being located over said covering means while said original support means is in said second region so that said covering means is in said second region enabling said covering means to be opened;

power supply means for supplying electric power to said means for detachably storing an exposure lamp; and switching means for switching off the electric power supply when said original support means is in said second region.

30. An imaging forming apparatus according to claim 29, further comprising;

engaging means for engaging said original support means, said engaging means being movable between a first position for restricting the movement of said original support means within said first region by engagement with said original support means and a second position for allowing said original support means to move into said second region by releasing the engagement; and wherein said switching means is operatively connected with said engaging means and switches off said electric power supply while said engaging means is in said second position.

31. The image forming apparatus according to claim 30, wherein said engaging means includes a release element having an operating portion which is accessible from outside of said housing, and wherein said switch is operated by said release element.

32. The image forming apparatus according to claim 29, further comprising:

a moving member being movable in response to movement of said covering means from a closed position to an open position, and wherein said switching means also switches off the electric power supply when said moving member is moved to said opened position.

33. An image forming apparatus according to claim 25, further comprising:

a moving member being movable in response to movement of said covering means from said closed position to said open position;

power supply means for supplying electric power to said means for detachably storing an exposure lamp; and switch means for switching off the electric power supply in response to said moving member when said covering means is moved to said open position.

* * * * *